(12) United States Patent
Glenn et al.

(10) Patent No.: US 6,486,545 B1
(45) Date of Patent: Nov. 26, 2002

(54) PRE-DRILLED BALL GRID ARRAY PACKAGE

(75) Inventors: Thomas P. Glenn, Gilbert, AZ (US); Steven Webster, Muntinlupa (PH); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/916,848

(22) Filed: Jul. 26, 2001

(51) Int. Cl.[7] .............................................. H01L 23/02
(52) U.S. Cl. ...................... 257/686; 257/723
(58) Field of Search ................... 257/686, 723, 257/690; 361/761; 359/819; 438/108, 106, 124

(56) References Cited

U.S. PATENT DOCUMENTS

| | | | | |
|---|---|---|---|---|
| 5,594,275 A | * | 1/1997 | Kwon et al. ................. | 257/686 |
| 5,608,262 A | * | 3/1997 | Degani et al. ............... | 257/723 |
| 5,952,714 A | | 9/1999 | Sano et al. .................. | 257/680 |
| 5,973,393 A | * | 10/1999 | Chia et al. ................... | 257/690 |
| 6,020,629 A | * | 2/2000 | Farnworth et al. .......... | 257/686 |
| 6,144,507 A | * | 11/2000 | Hashimoto ................... | 359/819 |
| 6,154,370 A | * | 11/2000 | Degani et al. ............... | 361/761 |
| 6,208,019 B1 | | 3/2001 | Tane et al. ................... | 257/679 |
| 6,291,259 B1 | * | 9/2001 | Chun .......................... | 438/106 |
| 6,287,893 B1 | * | 11/2001 | Elenius et al. .............. | 438/108 |
| 6,326,244 B1 | * | 12/2001 | Brooks et al. .............. | 438/124 |
| 6,384,472 B1 | | 5/2002 | Huang ......................... | 257/680 |

OTHER PUBLICATIONS

US patent application publication US 2001/0054758 by Isaak (Dec. 27, 2001).*

* cited by examiner

*Primary Examiner*—David Nelms
*Assistant Examiner*—Thinh T. Nguyen
(74) *Attorney, Agent, or Firm*—Gunnison, McKay & Hodgson, L.L.P.; Serge J. Hodgson

(57) ABSTRACT

A ball grid array (BAG) package includes a substrate having a central aperture. Traces are coupled to a lower surface of the substrate. First ends of the traces support an electronic component in the central aperture. Interconnection balls are formed on second ends of the traces. The interconnection balls extend from the second ends of the traces, through the substrate, and protrude above a second surface of the substrate.

34 Claims, 8 Drawing Sheets

PRE-DRILLED BALL GRID ARRAY PACKAGE

BACKGROUND OF THE INVENTION

1. Field of the Invention

The present invention relates generally to the packaging of electronic components. More particularly, the present invention relates to a ball grid array package.

2. Description of the Related Art

Ball grid array (BGA) packages are well known to those of skill in the art. BGA packages contained an electronic component. The electronic component was mounted to a substrate. The bond pads of the electronic component were electrically connected to a plurality of solder balls, sometimes called interconnection balls, on a lower surface of the substrate of the BGA package. The solder balls were arranged in an array hence the name ball grid array package.

Advantageously, by arranging the solder balls in an array, a high density of interconnects could be formed in a relatively small area. For this reason, the BGA package became increasingly popular as the number of required interconnects to the electronic component increased.

However, as the art moved to smaller and lighter weight electronic devices, it became increasingly important that the thickness of the BGA package used within these electronic devices was small. Disadvantageously, the conventional BGA package was relatively thick. Accordingly, the conventional BGA package was not well suited for use with smaller and lighter weight electronic devices.

SUMMARY OF THE INVENTION

In accordance with one embodiment of the present invention, a ball grid array (BGA) package includes a substrate having a central aperture. Electrically conductive traces are coupled to a lower surface of the substrate. An electronic component is flip chip mounted to first ends of the traces by electrically conductive bumps, the traces supporting the electronic component in the central aperture.

Electrically conductive interconnection balls are formed on second ends of the traces. The interconnection balls extend from the second ends of the traces, through the substrate, and protruding above a second surface of the substrate.

Advantageously, the BGA package is relatively thin compared to prior art BGA packages. In particular, by mounting the electronic component in the central aperture, the thickness of the BGA package is minimized. Accordingly, the BGA package is well suited for use with miniature lightweight electronic devices, which require thin and lightweight BGA packages.

In accordance with an alternative embodiment of the present invention, a stacked BGA package includes an upper substrate having a first central aperture. Electrically conductive upper traces are coupled to a lower surface of the upper substrate, the upper traces comprising pinholes. A first electronic component is flip chip mounted to first ends of the upper traces by electrically conductive first bumps, the upper traces supporting the first electronic component in the first central aperture.

The stacked BGA package further includes a lower substrate having a second central aperture. Electrically conductive lower traces are coupled to a lower surface of the lower substrate. A second electronic component is flip chip mounted to first ends of the lower traces by electrically conductive second bumps, the lower traces supporting the second electronic component in the second central aperture.

Interconnection rods extend from the lower traces, through the lower substrate, through the pinholes, through the upper substrate, and to a height above an upper surface of the upper substrate.

Advantageously, since the interconnection rods pass through the pinholes, the interconnection rods are locked to the upper traces. Accordingly, the reliability of the electrical connection between the interconnection rods and the upper traces is extremely high. In this manner, the reliability of the stacked BGA package is maximized.

Further, the amount of area on the larger substrate, e.g., printed circuit mother board, allocated for interconnection with the stacked BGA package is reduced compared to mounting the first and second electronic components separately as separate BGA packages. Advantageously, the stacked BGA package in accordance with this embodiment of the present invention is well suited for use with smaller and lighter weight electronic devices.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
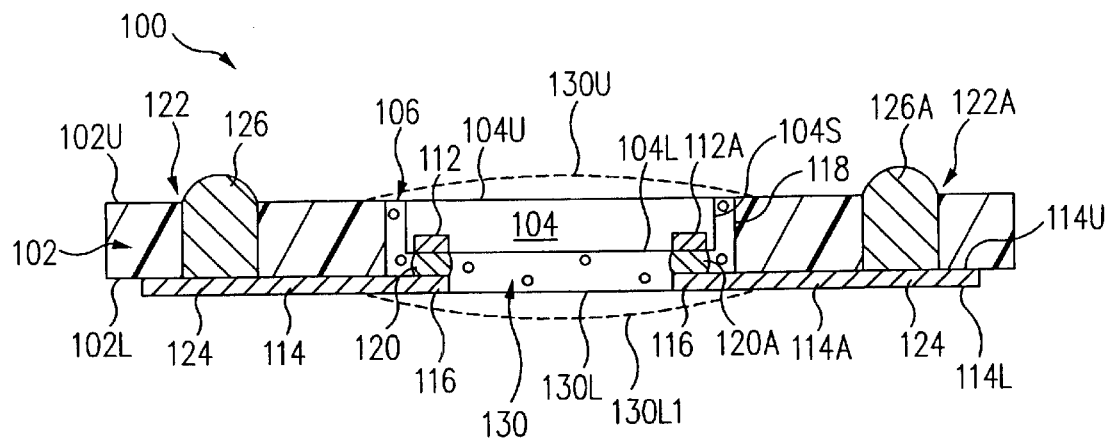
FIG. 1 is a cross-sectional view of a ball grid array (BGA) package in accordance with one embodiment of the present invention.

In accordance with one embodiment of the present invention, a ball grid-array (BGA) package 100 (FIG. 1)

includes a substrate 102 having a central aperture 106. Electrically conductive traces 114 on a lower surface 102L of substrate 102 include tabs 116 projecting below and under hanging central aperture 106. An electronic component 104 is flip chip mounted to tabs 116 and thus supported in central aperture 106 by tabs 116. Electronic component 104 and tabs 116 are sealed in an encapsulant 130. Interconnection balls 126 are formed at second ends 124 of traces 114 and arranged in an array.

Advantageously, BGA package 100 is relatively thin compared to prior art BGA packages. In particular, by mounting electronic component 104 in central aperture 106, the thickness of BGA package 100 is minimized. Accordingly, BGA package 100 is well suited for use with miniature lightweight electronic devices, which require thin and lightweight BGA packages.

More particularly, FIG. 1 is a cross-sectional view of a ball grid array (BGA) package 100 in accordance with one embodiment of the present-invention. Referring to FIG. 1, BGA package 100 includes a substrate 102 and an electronic component 104 such as an integrated circuit chip mounted in a central aperture 106 of substrate 102.

In this embodiment, central aperture 106 is at, or near, the center of substrate 102. However, in other embodiments, central aperture 106 is offset from the center of substrate 102. Illustratively, substrate 102 is printed circuit board, ceramic or tape although other substrate materials are used in other embodiments.

Central aperture 106 is defined by a sidewall 118, which extends from a lower, e.g., first, surface 102L of substrate 102 to an upper, e.g., second, surface 102U of substrate 102.

Electronic component 104, sometimes called a chip or die, includes a plurality of bond pads 112 on a lower, e.g., first, surface 104L of electronic component 104. Bond pads 112 are connected to the internal circuitry of electronic component 104. Electronic component 104 further includes an upper, e.g., second, surface 104U opposite lower surface 104L and a side 104S, which extends between lower surface 104L and upper surface 104U.

Formed on lower surface 102L of substrate 102 are a plurality of electrically conductive traces 114, which include a first trace 114A. More particularly, upper, e.g., first, surfaces 114U of traces 114 are mounted to lower surface 102L of substrate 102. Lower, e.g., second, surfaces 114L of traces 114 are exposed as illustrated in FIG. 1. Alternatively, a protective dielectric layer, e.g., solder mask, is formed to cover and protect lower surfaces 114L of traces 114.

Substrate 102 is an electrical insulator or includes an electrically insulating layer on lower surface 102L. Generally, a conductive layer is formed and patterned or a conductive layer is selectively formed to form traces 114 as described further below.

Referring to trace 114A, a first end 116 of trace 114A projects laterally inwards beyond sidewall 118 and towards the center of central aperture 106 of substrate 102. In other words, end 116, hereinafter referred to as tab 116, of trace 114A hangs below central aperture 106. The other traces 114 have tabs 116 in a similar manner and so are not discussed further to avoid detracting from the principals of the invention.

Although the terms upper, lower, below, above and similar terms are used herein, it is understood that these terms are used generally and without a gravitational reference, i.e., BGA package 100 can be oriented in a variety of fashions such as inverted from the view of FIG. 1.

Bond pads 112 are electrically connected to corresponding traces 114, and, more particularly, to corresponding tabs 116, by electrically conductive bumps 120, which include a first bump 120A. In one embodiment, electrically conductive bumps 120 are: (1) solder; (2) stud bumps, i.e., gold balls; (3) electrically conductive epoxy paste; or (4) electrically conductive epoxy film as are well known to those of skill in the art. Electronic component 104 is sometimes referred to as flip chip mounted to tabs 116.

As shown in FIG. 1, electronic component 104 is supported in central aperture 106 by tabs 116, and more generally, by traces 114. Tabs 116 extend laterally inwards below central aperture 106 to bond pads 112. Electronic component 104 is physically supported on tabs 116 by bumps 120.

Substrate 102 is formed with interconnection ball apertures 122, sometimes called interconnection ball sites. Interconnection ball apertures 122 are covered at lower surface 102L by traces 114, and more specifically, by second ends 124 of traces 114.

To illustrate, a first interconnection ball aperture 122A of the plurality of interconnection ball apertures 122 is covered at lower surface 102L by second end 124 of trace 114A. The other interconnection ball apertures 122 are covered at lower surface 102L by second ends 124 of the other traces 114 in a similar manner and so are not discussed further to avoid detracting from the principals of the invention.

Electrically conductive interconnection balls 126 are formed in and fill interconnection ball apertures 122. Stated another way, interconnection ball apertures 122 and traces 114 form pockets and interconnection balls 126 are formed in these pockets. In this manner, interconnection balls 126 are formed on and electrically connected to corresponding traces 114 and, more particularly, to second ends 124 of traces 114.

To illustrate, a first interconnection ball 126A of the plurality of interconnection. balls 126 fills interconnection ball aperture 122A and is formed on and electrically connected to trace 114A. The other interconnection balls 126 fill the other interconnection ball apertures 122 and are formed on and electrically connected to the other traces 114 in a similar manner and so are not discussed further to avoid detracting from the principals of the invention.

To illustrate the electrical connection of interconnection balls 126 with bond pads 112, a first bond pad 112A of the plurality of bond pads 112 of electronic component 104 is electrically connected to race 114A by bump 120A. Trace 114A is electrically connected to interconnection ball 126A.

As set forth above, an electrically conductive pathway between bond pad 112A and interconnection ball 126A is formed by bump 120A and trace 114A. The other bond pads 112, traces 114, bumps 120, and interconnection balls 126 are electrically connected to one another in a similar fashion and so are not discussed further to avoid detracting from the principals of the invention.

Although a particular electrically conductive pathway between bond pad 112A and interconnection ball 126A is described above, in light of this disclosure, it is understood that other electrically conductive pathways can be formed. For example, instead of direct electrical connections between bond pads 112 and bumps 120, between bumps 120 and traces 114, and between traces 114 and interconnection balls 126, contact metallizations are interposed between the items.

Further, it is understood that the number of bond pads 112, bumps 120, traces 114, and interconnection balls 126 used depends upon the particular input/output requirements of electronic component 104. In addition, interconnection balls 126 are distributed in a variety of formats, e.g., in an array format to form a ball grid array (BGA) package.

In one embodiment, electronic component 104, interconnection bumps 120, and tabs 116 are sealed within an encapsulant 130. More generally, central aperture 106 is filled with encapsulant 130 such that encapsulant 130 contacts sidewall 118 of substrate 102.

Advantageously, encapsulant 130 protects electronic component 104, e.g., from dust and moisture. Further, encapsulant 130 increases the reliability of BGA package 100 by protecting bond pads 112, bumps 120 and tabs 116 from being shorted to one another or to other electrically conductive structures adjacent BGA package 100. In addition, encapsulant 130 compensates for any differential thermal expansion between tabs 116 and electronic component 104 thus minimizing the possibility of failure of bumps 120 and the associated failure of BGA package 100.

In one embodiment, encapsulant 130 contacts lower surface 104L and side 104S of electronic component 104. However, in accordance with this embodiment, encapsulant 130 does not contact upper surface 104U of electronic component 104 such that upper surface 104U is exposed.

In accordance with this embodiment, exposed upper surface 104U of electronic component 104 is below upper surface 102U of substrate 102, i.e., electronic component 104 fits entirely within central aperture 106. Advantageously, interconnection balls 126 extend from second ends 124 of traces 114 and lower surface 102L of substrate 102 through substrate 102 and protrude above upper surfaces 102U, 104U of substrate 102, electronic component 104, respectively.

Interconnection balls 126 are used to electrically connect BGA package 100 to a larger substrate (not shown) such as a printed circuit mother board. More particularly, BGA package 100 is mounted to the larger substrate such that upper surface 102U is adjacent and faces the larger substrate. Accordingly, lower surface 102L of substrate 102 is opposite and face away from the larger substrate in this embodiment.

In an alternative embodiment, exposed upper surface 104U of electronic component 104 is above upper surface 102U of substrate 102. In accordance with this embodiment, interconnection balls 126 extend to a height above upper surface 102U of substrate 102 greater than the height of upper surface 104U of electronic component 104 above upper surface 102U of substrate 102 to provide an acceptable clearance between upper surface 104U of electronic component 104 and the larger substrate. Alternatively, the larger substrate is formed with an aperture corresponding to electronic component 104.

In an alternative embodiment, encapsulant 130 contacts a periphery of upper surface 104U of electronic component 104 directly adjacent side 104S. In yet a further alternative embodiment, encapsulant 130 entirely contacts and encloses upper surface 104U of electronic component 104. In accordance with this embodiment, an upper, e.g., first, surface 130U of encapsulant 130 is above upper surface 104U of electronic component 104 as indicated by the dashed line.

In accordance with this embodiment, upper surface 130U of encapsulant 130 is below upper surface 102U of substrate 102, i.e., electronic component 104 and encapsulant 130 fit entirely within central aperture 106. Advantageously, interconnection balls 126 protrude above upper surfaces 102U, 130U of substrate 102, encapsulant 130, respectively.

In an alternative embodiment, upper surface 130U of encapsulant 130 is above upper surface 102U of substrate 102. In accordance with this embodiment, interconnection balls 126 extend to a height above upper surface 102U of substrate 102 greater than the height of upper surface 130U of encapsulant 130 above upper surface 102U of substrate 102 to provide an acceptable clearance between upper surface 130U of encapsulant 130 and the larger substrate. Alternatively, the larger substrate is formed with an aperture corresponding to encapsulant 130.

Further, in one embodiment, encapsulant 130 encloses bumps 120 and contacts:upper surfaces 114U of tabs 116. In accordance with this embodiment, a lower, e.g., second, surface 130L of encapsulant 130 is coplanar with lower surfaces 114L of traces 114.

However, in yet another alternative embodiment, encapsulant 130 entirely encloses tabs 116. In accordance with this embodiment, lower surface 130L of encapsulant 130 is below lower surfaces 114L of traces 114 as indicated by the dashed line 130L1. In yet another alternative embodiment, encapsulant 130 is not formed.

Advantageously, BGA package 100 is relatively thin compared to prior art BGA packages. In particular, by mounting electronic component 104 in central aperture 106, the thickness of BGA package 100 is minimized. Accordingly, BGA package 100 is well suited for use with miniature lightweight electronic devices, which require thin and lightweight ball grid array packages.

Figure 2:
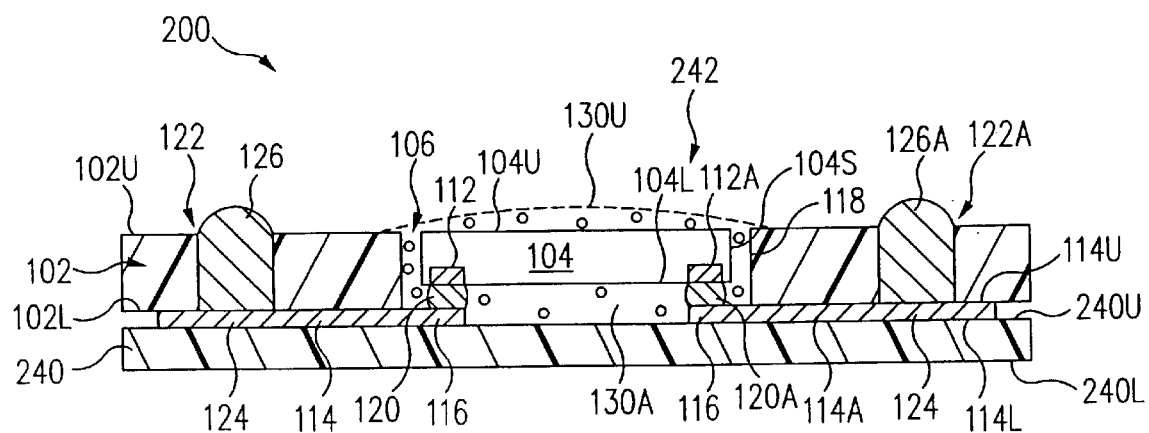
FIG. 2 is a cross-sectional view of a BGA package in accordance with another embodiment of the present invention.

FIG. 2 is a cross-sectional view of a ball grid array (BGA) package 200 in accordance with another embodiment of the present invention. BGA package 200 of FIG. 2 is similar to BGA package 100 of FIG. 1 and only the significant differences are discussed below.

Referring now to FIG. 2, BGA package 200 includes a support member 240. Illustratively, support member 240 is printed circuit board, ceramic or tape although other support members are used in other embodiments.

As shown in FIG. 2, an upper, e.g., first, surface 240U of support member 240 is mounted to lower surfaces 114L of traces 114 and, more generally, to lower surface 102L of substrate 102, e.g., with adhesive. A lower, e.g., second, surface 240L of support member 240 is exposed.

In the embodiment illustrated in FIG. 2, support member 240 is the same size as substrate 102. However, in alternative embodiments, the size of support member 240 is greater than or less than the size of substrate 102.

In one embodiment, support member 240 is an electrical insulator or includes an electrically insulative layer, sometimes called a dielectric layer, on upper surface 240U of support member 240. In this manner, shorting of traces 114 by support member 240 is prevented.

However, in an alternative embodiment, an electrically insulative layer, e.g., solder mask, is formed on, covers and electrically insulates traces 114 from support member 240, which can be an electrical conductor in this embodiment.

Advantageously, support member 240 adds rigidity and strength to BGA package 200 thus maximizing the reliability of BGA package 200. Support member 240 minimizes bending of tabs 116 and supports tabs 116 during flip chip bonding of electronic component 104. Further, in one embodiment, support member 240 is a material having a relatively high thermal conductivity, e.g., is metal or metal containing. Accordingly, support member 240 functions as a heat sink to dissipate heat from BGA package 200. Since lower surface 240L of support member 240 is exposed directly to the ambient environment, support member 240 is extremely effective as a heat sink.

Upper surface 240U of support member 240 in cooperation with sidewall 118 form a pocket 242. Stated another way, support member 240 seals central aperture 106 at lower surface 102L of substrate 102 to form pocket 242.

Encapsulant 130A is formed in and fills pocket 242. More particularly, encapsulant 130A underfills electronic component 104, i.e., fills the space between electronic component 104 and support member 240. In one embodiment, encapsulant 130A contacts sidewall 118 of substrate 102.

Further, encapsulant 130A entirely encloses upper surface 104U of electronic component 104 as illustrated in FIG. 2. Alternatively, encapsulant 130A contacts side 104S of electronic component 104 only or extends over and contacts a periphery of upper surface 104U as discussed above with regards to encapsulant 130 of BGA package 100 of FIG. 1. In yet another alternative embodiment, encapsulant 130A is not formed.

Figure 3:
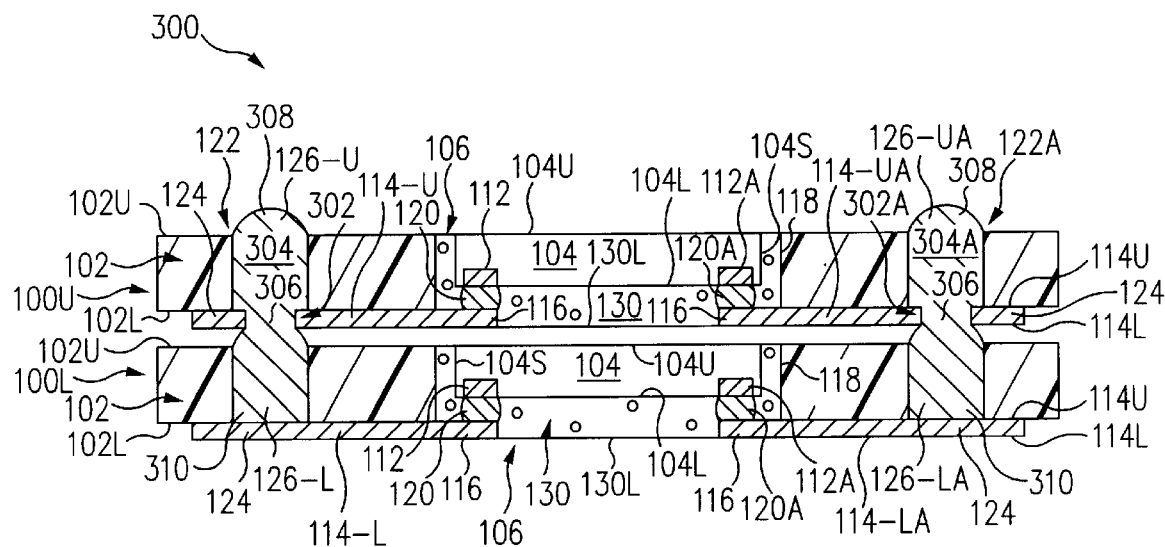
FIG. 3 is a cross-sectional view of a stacked BGA package in accordance with yet another alternative embodiment of the present invention.

FIG. 3 is a cross-sectional view of a stacked BGA package 300 in accordance with yet another alternative embodiment of the present invention. Stacked BGA package 300 includes an upper, e.g., first, BGA package 100U stacked on a lower, e.g., second, BGA package 100L. BGA packages 100U, 100L of FIG. 3 are similar to BGA package 100 of FIG. 1 and only the significant differences are discussed below.

Referring now to FIG. 3, BGA packages 100U, 100L include upper traces 114-U and lower traces 114-L, respectively. Lower traces 114-L of lower BGA package 100L are similar to traces 114 of BGA package 100 of FIG. 1. Upper traces 114-U of upper BGA package 100U are similar to traces 114 of package 100 of FIG. 1 except that upper traces 114-U include pinholes 302.

To illustrate, a first upper trace 114-UA of the plurality of upper traces 114-U includes a first pinhole 302A of the plurality of pinholes 302. The other upper traces 114-U have corresponding pinholes 302 in a similar manner and so are not discussed further to avoid detracting from. the principals of the invention.

BGA packages 100U, 100L include upper interconnection balls 126-U and lower interconnection balls 126-L, respectively. Upper interconnection balls 126-U are fused with corresponding lower interconnection balls 126-L into interconnection rods 304.

Interconnection rods 304 are hourglass shaped in this embodiment. More particularly, interconnection rods 304 have necks 306, sometimes called thin portions, which extend through pinholes 302. Interconnection rods 304 further have upper body portions 308 and lower body portions 310. Necks 306 are between and connect upper body portions 308 to lower body portions 310. Necks 306 are thinner than upper body portions 308 and are also thinner than lower body portions 310.

Interconnection rods 304 extend from lower traces 114-L, through substrate 102 of lower BGA package 100L, through pinholes 302, through substrate 102 of upper BGA package 100U and to a height above upper surface 102U of substrate 102 of upper BGA package 100U.

More particularly, lower body portions 310 of interconnection rods 304 extend between lower traces 114-L and upper traces 114-U and to necks 306. Necks 306 pass through pinholes 302 of upper traces 114-U. Upper body portions 308 extends from upper traces 114-U and necks 306 through substrate 102 of upper BGA package 100U to a height above upper surface 102U of substrate 102 of upper BGA package 100U in a manner similar to that described above with regards to interconnection balls 126 of BGA package 100 of FIG. 1.

To illustrate, upper BGA package 100U includes a first upper interconnection ball 126-UA of the plurality of upper interconnection balls 126-U. Similarly, lower BGA package 100L includes a first lower interconnection ball 126-LA of the plurality of lower interconnection balls 126-L. Upper interconnection ball 126-UA is fused with lower interconnection ball 126-LA into a first interconnection rod 304A of the plurality of interconnection rods 304.

Interconnection rod 304A extends from lower trace 114-LA, through substrate 102 of lower BGA package 100L, through pinhole 302A, through substrate 102 of upper BGA package 100U and to a height above upper surface 102U of substrate 102 of upper BGA package 100U.

More particularly, lower body portion 310 of interconnection rod 304A extends between lower trace 114-LA and upper trace 114-UA and to neck 306 of interconnection rod 304A. Neck 306 of interconnection rod 304A passes through pinhole 302A of upper trace 114-UA. Upper body portion 308 of interconnection rod 304A extends from upper trace 114-UA and neck 306 of interconnection rod 304A through substrate 102 of upper BGA package 100U to a height above upper surface 102U of substrate 102 of upper BGA package 100U. The other interconnection rods 304 are similar to interconnection rod 304A and so are not discussed further to avoid detracting from the principals of the invention.

Interconnection rods 304 support substrate 102 of upper BGA package 100U above substrate 102 of lower BGA package 100L. Further, interconnection rods 304 form the electrical interconnects with traces 114-U, 114-L.

Advantageously, since interconnection rods 304 pass through pinholes 302, interconnection rods 304 are locked to upper traces 114-U. Accordingly, the reliability of the electrical connection, sometimes called solder joint, between interconnection rods 304 and upper traces 114-U is extremely high. In this manner, the reliability of stacked BGA package 300 is maximized.

Further, by stacking upper BGA package 100U on top of lower BGA package 100L, the amount of area on the larger substrate, e.g., printed circuit mother board, allocated for interconnection with electronic components 104 is reduced compared to mounting BGA packages 100U, 100L each separately to the printed circuit mother board. Advantageously, stacked BGA package 300 is well suited for use with smaller and lighter weight electronic devices.

In accordance with one embodiment, at least one interconnection rod 304 is connected to a bond pad 112 of electronic component 104 of lower BGA package 100L only and is not connected to a bond pad 112 of electronic component 104 of upper BGA package 100U. In accordance with this embodiment, the at least one interconnection rod 304 functions as a via through upper BGA package 100U and allows selective electrical interconnection with particular bond pads 112 of electronic component 104 of lower BGA package 100L.

For example, instead of being electrically connected to bond pad 112A by bump 120A of upper BGA package 100U as illustrated in FIG. 3, upper trace 114-UA of upper BGA package 100U does not extend to and is not connected to bond pad 112A of upper BGA package 100U. In accordance with this example, interconnection rod 304A functions as a via through upper BGA package 100U allowing selective electrical interconnection with bond pad 112A of electronic component 104 of lower BGA package 100L.

In yet another alternative embodiment, at least one upper interconnection ball 126-U of upper BGA package 100U is connected to a bond pad 112 of electronic component 104 of upper BGA package 100U only and is not connected to a bond pad 112 of electronic component 104 of lower BGA package 100L. In this manner, selective electrical interconnection with particular bond pads 112 of electronic component 104 of upper BGA package 100U is achieved.

For example, trace 114-UA of upper BGA package 100U is formed without pinhole 302A. In accordance with this example, upper interconnection ball 126-UA of upper BGA package 100U is not fused to lower interconnection ball 126-LA of lower BGA package 100L as illustrated in FIG. 3. Lower interconnection ball 126-LA of lower BGA package 100L is fused with an upper interconnection ball 126-U (not shown) other then upper interconnection ball 126-UA. Upper interconnection ball 126-UA allows selective electrical interconnection with bond pad 112A of electronic component 104 of upper BGA package 100U in accordance with this embodiment.

Figure 4:
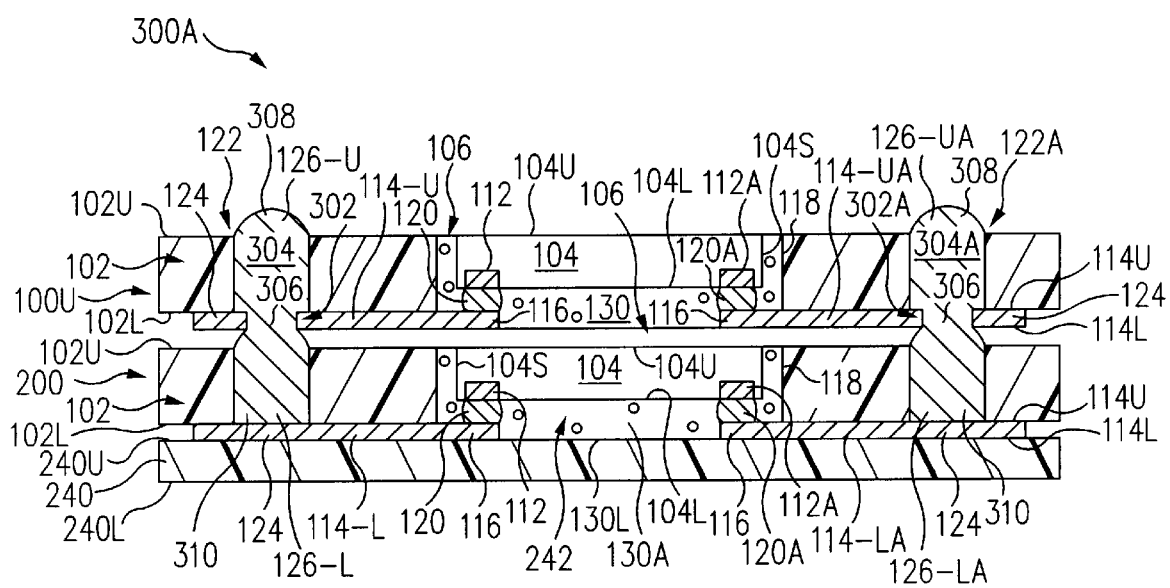
FIG. 4 is a cross-sectional view of a stacked BGA package in accordance with yet another alternative embodiment of the present invention.

FIG. 4 is a cross-sectional view of a stacked BGA package 300A in accordance with yet another alternative embodiment of the present invention. Stacked BGA package 300A of FIG. 4 is similar to stacked BGA package 300 of FIG. 3 except that lower BGA package 100L of stacked BGA package 300 of FIG. 3 has been replaced with BGA package 200 of FIG. 2.

Figure 5:
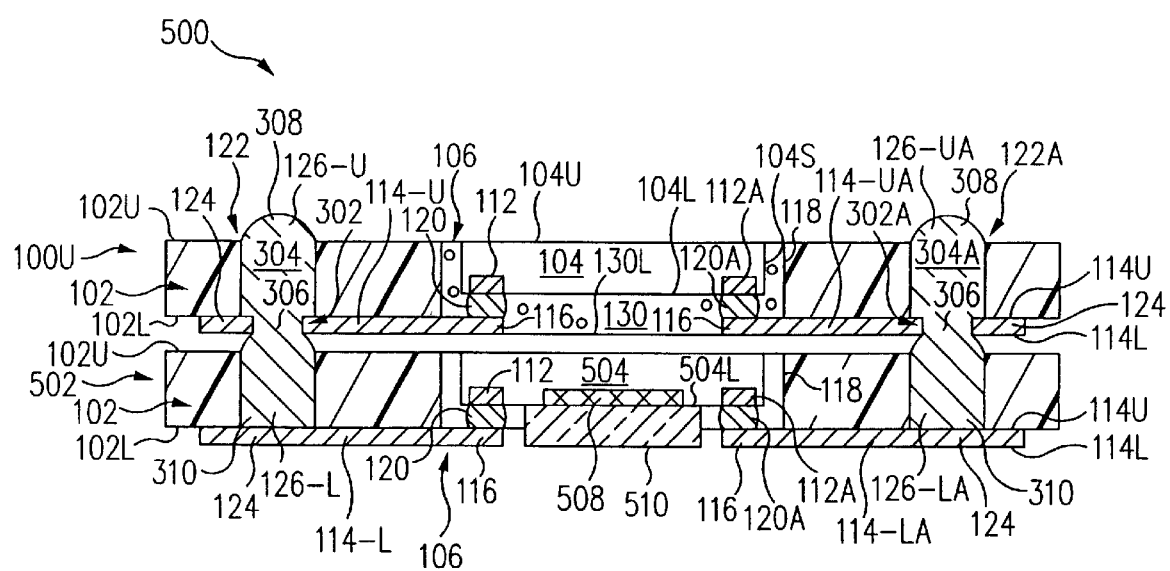
FIG. 5 is a cross-sectional view of a stacked image sensor BGA package in accordance with yet another alternative embodiment of the present invention.

FIG. 5 is a cross-sectional view of a stacked image sensor BGA package 500, hereinafter package 500, in accordance with yet another alternative embodiment of the present invention. Package 500 of FIG. 5 is similar to stacked BGA package 300 of FIG. 3 except that lower BGA package 100L of stacked BGA package 300 of FIG. 3 has been replaced with an image sensor package 502.

Illustratively, image sensor package 502 is fabricated using a method as described in Glenn et al., U.S. patent application Ser. No. 09/896,074, entitled "PRE-DRILLED IMAGE SENSOR PACKAGE FABRICATION METHOD", filed on Jun. 28, 2001, which is herein incorporated by reference in its entirety.

Image sensor package 502 of package 500 of FIG. 5 is similar to BGA package 100 of FIG. 1 and only the significant differences are discussed below. Referring now to FIG. 5, image sensor package 502 includes an image sensor 504, i.e., a specific type of electronic component. Image sensor 504 includes an active area 508 on a lower, e.g., first, surface 504L of image sensor 504. Generally, active area 508 is responsive to radiation, e.g., electromagnetic radiation, as is well known to those of skill in the art. For example, active area 508 is responsive to infrared radiation, ultraviolet light, and/or visible light. Illustratively, image sensor 504 is a CMOS image sensor device, a charge coupled device (CCD), a pyroelectric ceramic on CMOS device, or an erasable programmable read-only memory device (EPROM) although other image sensors are used in other embodiments.

Mounted to lower surface 504L of image sensor 504 is a window 510. More particularly, window 510 covers and protects active area 508. Generally, window 510 is transparent to the radiation of interest, e.g., to the radiation to which active area 508 of image sensor 504 is responsive, as those of skill in the art will understand. In one embodiment, window 510 is borosilicate glass although other materials are used in other embodiments.

Image sensor 504 further includes a plurality of bond pads 112 on lower surface 504L of image sensor 504.

As shown in FIG. 5, image sensor 504 is supported in central aperture 106 by tabs 116, and more generally, by lower traces 114-L. Tabs 116 extend laterally inwards below central aperture 106 to bond pads 112. However, tabs 116 extend laterally inwards only below a periphery of central aperture 106. Stated another way, tabs 116 do not extend inwards significantly beyond bond pads 112 and do not reach active area 508. Accordingly, active area 508 is unobstructed by tabs 116.

During use, radiation, e.g., electromagnetic radiation, is directed at package 500 and image sensor 504. This electromagnetic radiation strikes window 510, passes through window 510, and strikes active area 508, which responds to the electromagnetic radiation. Of importance, tabs 116 do not obstruct this electromagnetic radiation.

However, in an alternative embodiment, active area 508 of image sensor 504 transmits radiation such as electromagnetic radiation. For example, image sensor 504 is a light emitting diode (LED) micro-display. In accordance with this embodiment, electromagnetic radiation transmitted by active area 508 passes through window 510 and emanates from package 500. For simplicity, in the above and following discussions, active area 508 as a receiver of radiation is set forth. However, in light of this disclosure, those of skill in the art will recognize that generally active area 508 can be a receiver of radiation, a transmitter of radiation, or a transceiver, i.e., a transmitter and a receiver, of radiation.

Figure 6:
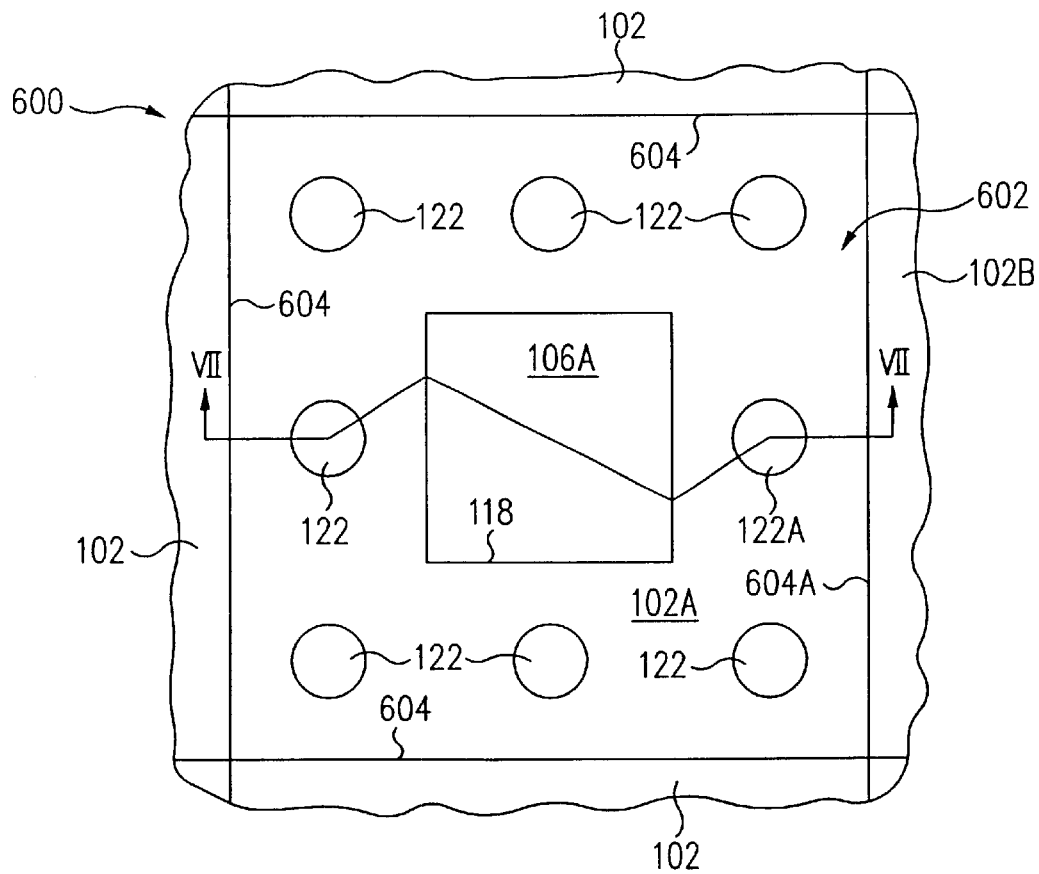
FIG. 6 is a top plan view of an array of BGA packages during fabrication in accordance with one embodiment of the present invention.
Figure 7:
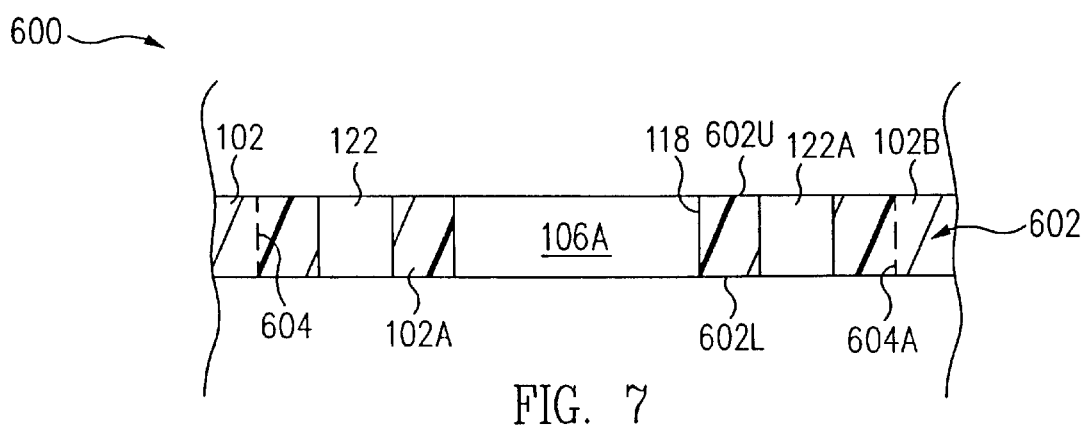
FIG. 7 is a cross-sectional view of the array along the line VII—VII of FIG. 6.

In one embodiment, BGA package 100 (FIG. 1) is fabricated simultaneously with a plurality of BGA packages 100 to minimize the cost associated with each individual BGA package 100. FIG. 6 is a top plan view of an array 600 of BGA packages 100 during fabrication in accordance with one embodiment of the present invention. FIG. 7 is a cross-sectional view of array 600 along the line VII—VII of FIG. 6.

Referring now to FIGS. 6 and 7 together, array 600 includes a BGA substrate 602. BGA substrate 602 includes a plurality of individual substrates 102 integrally connected together in an array format. For example, BGA substrate 602 includes a 4×4 array of substrates 102 integrally connected together for a total of sixteen substrates 102, although it is understood that other array formats and number of substrates 102 are used in other embodiments.

Each of substrates 102 is delineated by a singulation street 604, which is located between adjacent substrates 102. For example, a first singulation street 604A of the plurality of singulation streets 604 delineates a first substrate 102A of the plurality of substrates 102 from a second substrate 102B of the plurality of substrates 102. The other substrates 102 are similarly delineated from adjacent substrates 102 by corresponding singulation streets 604.

Central apertures 106 are formed in BGA substrate 602. More particularly, central apertures 106 are formed in substrates 102. For example, a first central aperture 106A of the plurality of central apertures 106 is formed 10 in substrate 102A. The other central apertures 106 are formed in the other corresponding substrates 102 in a similar manner.

Central apertures 106 are formed using any one of a number of techniques, for example, by lasering, mechanically drilling, or punching. In one embodiment, edge coatings are formed to line sidewalls 118 of central apertures 106.

As shown in FIG. 6, central apertures 106 are rectangular, e.g., square. However, in alternative embodiments, central apertures 106 are formed in other shapes, e.g., central apertures 106 are circular.

Figure 8:
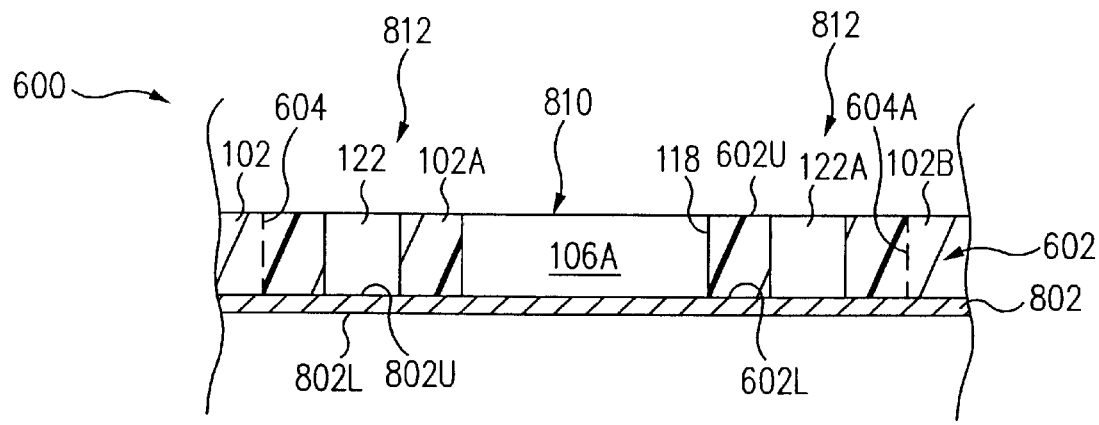
FIGS. 8 and 9 are cross-sectional views of the array of FIG. 6 at further stages during fabrication in accordance with embodiments of the present invention.

Interconnection ball apertures 122 are formed in BGA substrate 602. More particularly, a plurality of interconnection ball apertures 122 are formed in each of substrates 102. For example, interconnection ball aperture 122A is formed in substrate 102A. Interconnection ball apertures 122 are formed using any one of a number of techniques, for example, by lasering, mechanically drilling, or punching FIG. 8 is a cross-sectional view of array 600 of FIG. 6 at a further stage during fabrication in accordance with one embodiment of the present invention. Referring now to FIG. 8, an upper, e.g., first, surface 802U of an electrically conductive sheet 802 is mounted to a lower, e.g., first, surface 602L of BGA substrate 602, for example, with adhesive. Illustratively, sheet 802 is a metal foil, e.g., a copper foil.

Sheet 802 entirely covers lower surface 602L of BGA substrate 602. More particularly, sheet 802 extends under and covers central apertures 106 and interconnection ball apertures 122 at lower surface 602L of BGA substrate 602. Exposed regions 810, 812 of upper surface 802U of sheet 802 are exposed through central apertures 106, interconnection ball apertures 122, respectively.

Figure 9:
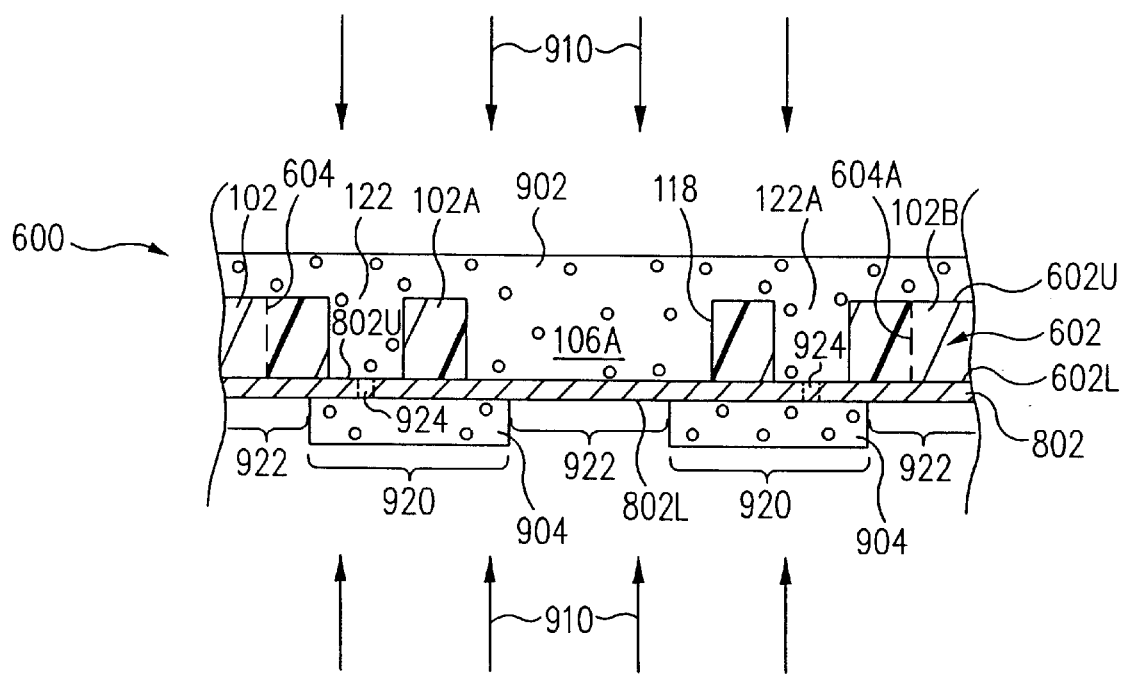

FIG. 9 is a cross-sectional view of array 600 of FIG. 8 at a further stage during fabrication in accordance with one embodiment of the present invention. Referring now to FIG. 9, an upper, e.g., first, mask 902, e.g., photoresist, is formed on an upper, e.g., second, surface 602U of BGA substrate 602. Upper mask 902 fills central apertures 106 and interconnection ball apertures 122. Upper mask 902 contacts and protects exposed regions 810, 812 (FIG. 8) of upper surface 802U of sheet 802. Upper mask 902 is sometimes referred to as a blanket mask since upper mask 902 is formed non-selectively on upper surface 602U and thus blankets upper surface 602U.

A lower, e.g., second, mask 904 is formed on a lower, e.g., second, surface 802L of sheet 802. In contrast to upper mask 902, lower mask 904 selectively covers and protects lower surface 802L of sheet 802. More particularly, lower mask 904 covers and protects trace regions 920 of sheet 802 from which traces 114 (FIG. 1) are formed. Lower mask 904 exposes etch regions 922 of sheet 802, which are removed in a subsequent etching operation as described further below.

Lower mask 904 is formed using any one of a number of techniques. For example, photoresist is applied to lower surface 802L of sheet 802. The photoresist is selectively exposed to radiation, e.g., ultraviolet radiation. The exposed or not exposed regions of the photoresist are removed depending upon the type of photoresist used, e.g., positive or negative photoresist, to form lower mask 904.

Array 600 is subjected to an etchant 910 in an etching operation. Etchant 910 etches and removes etch regions 922 of sheet 802, which are exposed by lower mask 904. However, trace regions 920 of sheet 802, which are protected from above and below by upper mask 902 and lower mask 904, respectively, are not etched by etchant 910 and remain. In this manner, sheet 802 is patterned to form traces 114 (FIG. 1). Upper mask 902 and lower mask 904 are removed.

Figure 10:
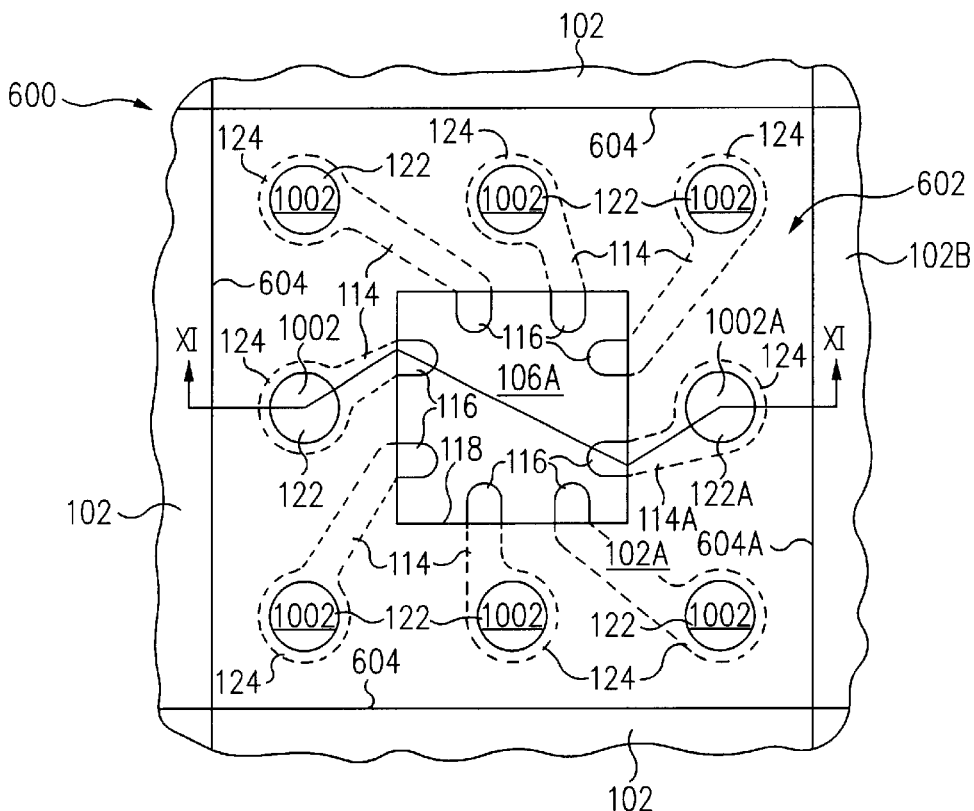
FIG. 10 is a top plan view of the array of FIG. 9 at a further stage during fabrication in accordance with one embodiment of the present invention.
Figure 11:
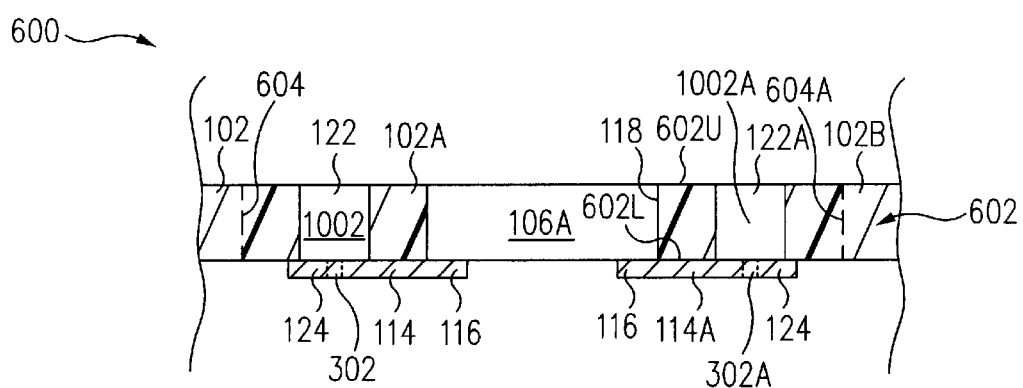
FIG. 11 is a cross-sectional view of the array along the line XI—XI of FIG. 10.

FIG. 10 is a top plan view of array 600 of FIG. 9 at a further stage during fabrication in accordance with one embodiment of the present invention. FIG. 11 is a cross-sectional view of array 600 along the line XI—XI of FIG. 10.

Referring now to FIGS. 10 and 11 together, trace regions 920 of sheet 802 (FIG. 9) form traces 114. Tabs 116 of traces 114 project below and under hang central apertures 106 of substrates 102. Further, second ends 124 of traces 114 cover and seal interconnection ball apertures 122 at lower surface 602L of BGA substrate 602, and, more generally, and lower surfaces 102L of substrates 102.

To illustrate, tab 116 of trace 114A extends below and under hangs central aperture 106A of substrate 102A. Further, second end 124 of trace 114A covers and seals interconnection ball aperture. 122A at lower surface 102U of substrate 102A. The other traces 114 extend below and under hang central apertures 106 and cover and seal the other interconnection ball apertures 122 in a similar manner and so are not discussed further to avoid detracting from the principals of the invention.

A plurality of pockets 1002 are defined by interconnection ball apertures 122 and second ends 124 of traces 114. To illustrate, a first pocket 1002A of the plurality of pockets 1002 is defined by interconnection ball aperture 122A and second end 124 of trace 114A. The other pockets 1002 are defined by the other interconnection ball apertures 122 and the other second ends 124 of traces 114 in a similar manner and so are not discussed further to avoid detracting from the principals of the invention.

Figure 12:
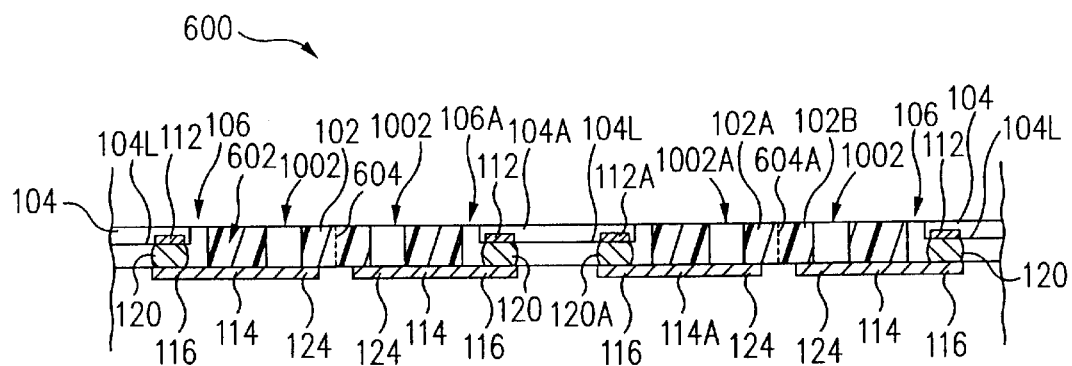
FIGS. 12, 13 and 14 are cross-sectional views of the array of FIG. 11 at further stages during fabrication in accordance with embodiments of the present invention.

FIG. 12 is a cross-sectional view of array 600 of FIG. 11 at a further stage during fabrication in accordance with one embodiment of the present invention. As shown in FIG. 12, electronic components 104 are generally mounted to substrates 102. For example, a first electronic component 104A of the plurality of electronic components 104 is mounted to first substrate 102A. The other electronic components 104 are mounted to corresponding substrates 102 in a similar manner.

More particularly, electronic components 104 are mounted to traces 114 and specifically to tabs 116 by bumps 120, sometimes called flip chip mounted to tabs 116. Electronic components 104 are supported in central apertures 106 by traces 114 and specifically by tabs 116. To illustrate, electronic component 104A is supported in central aperture 106A of substrate 102A. The other electronic components 104 are supported in the other central apertures 106 in a similar manner and so are not discussed further to avoid detracting from the principals of the invention.

To mount electronic components 104, bond pads 112 of each electronic component 104 are aligned with tabs 116 using any one of a number of alignment techniques, e.g., electronic components 104 are optically or mechanically aligned.

Bond pads 112 of electronic components 104 are attached to tabs 116 using any one of a number of techniques. For example, solder bumps 120 are formed on bond pads 112 of electronic components 104, or alternatively, on tabs 116, and solder bumps 120 are reflowed to attach bond pads 112 to tabs 116. Alternatively, bond pads 112 of electronic components 104 are attached to tabs 116 by bumps 120 formed of electrically conductive epoxy paste or film, which is thermally or optically cured.

As a further alternative, bond pads 112 of electronic components 104 are attached to tabs 116 by thermal or thermosonic bonding of gold bumps 120 formed on bond pads 112, or alternatively, on tabs 116. In light of this disclosure, those of skill in the art will understand that other methods of attaching electronic components 104 to tabs 116 can be used.

Generally, each bond pad 112 is electrically and physically connected to a corresponding tab 116 of traces 114 by a corresponding bump 120. To illustrate, bond pad 112A of electronic component 104A is electrically and physically connected to tab 116 of trace 114A by bump 120A. The other bond pads 112 are electrically and physically connected to the other tabs 116 by the other bumps 120 in a similar manner and so are not discussed further to avoid detracting from the principals of the invention.

Figure 13:
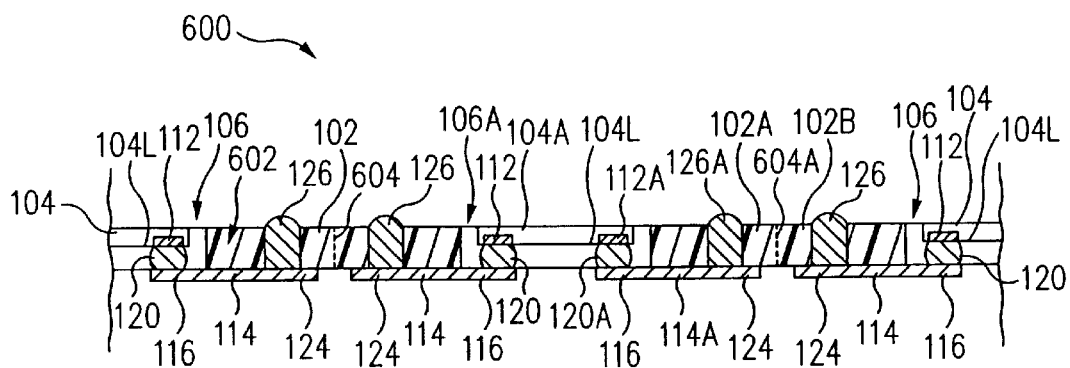

FIG. 13 is a cross-sectional view of array 600 of FIG. 12 at a later stage during fabrication in accordance with one embodiment of the present invention. Referring now to FIGS. 12 and 13 together, BGA substrate 602 is populated with interconnection balls 126.

More particularly, interconnection balls 126 are formed in pockets 1002. Illustratively, a solder paste is applied to fill pockets 1002 and this solder paste is reflowed to form interconnection balls 126. For example, solder paste is applied to fill pocket 1002A and this solder paste is reflowed to form interconnection ball 126A. Interconnection ball 126A is formed on and electrically connected to trace 114A. The other interconnection balls 126 are formed in a similar manner and so are not discussed further to avoid detracting from the principals of the invention.

Figure 14:
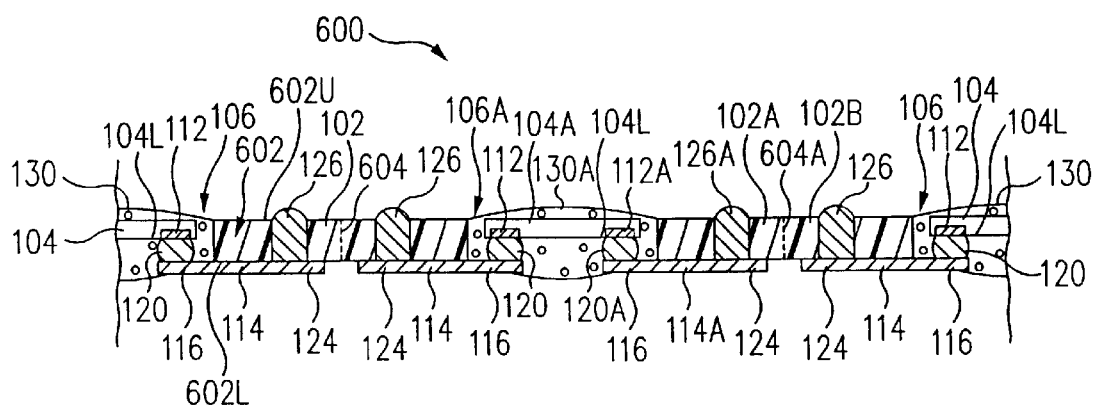

FIG. 14 is a cross-sectional view of array 600 of FIG. 13 at a later stage during fabrication in accordance with one embodiment of the present invention. As shown in FIG. 14, encapsulants 130 are formed around electronic components 104, bumps 120 and in central apertures 106. Illustratively, a high viscosity encapsulant is dispensed, e.g., with a needle dispenser, around electronic components 104 to form encapsulants 130. Alternatively, a plate or other flat member is placed on lower surface 602L or upper surface 602U of BGA substrate 602 to seal central apertures 106 and encapsulant is dispensed into central apertures 106 and cured to form encapsulants 130. The plate or other flat member is then removed.

To illustrate, a first encapsulant 130A of the plurality of encapsulants 130 is formed around electronic component 104A, bumps 120 and in central aperture 106A. The other encapsulants 130 are formed around electronic components 104, bumps 120 and in central apertures 106 in a similar manner and so are not discussed further to avoid detracting from the principals of the invention.

In an alternative embodiment, encapsulants 130 are formed before formation of interconnection balls 126. For example, encapsulants 130 are formed immediately after electronic components 104 are mounted to traces 114 (FIG. 12) and before formation of interconnection balls 126. In yet another alternative embodiment, encapsulants 130 are not formed.

Referring still to FIG. 14, array 600 is singulated into a plurality of individual BGA packages 100 (FIG. 1) by singulating BGA substrate 602 along singulation streets 604. Singulation is accomplished using any one of a number of singulation techniques, e.g., by laser cutting or mechanical sawing through BGA substrate 602 along singulation streets 604.

By forming a plurality of BGA packages 100 simultaneously, several advantages are realized. One advantage is that it is less labor intensive to handle and process a plurality of BGA packages 100 simultaneously rather than to handle and process each BGA package 100 on an individual basis. By reducing labor, the cost associated with each BGA package 100 is minimized. However, in light of this disclosure, those of skill in the art will recognize that BGA packages 100 can also be manufactured on an individual basis if desired.

BGA package 200 of FIG. 2 is formed in a manner similar to that described above with regards to BGA package 100 with the additional operation of mounting, e.g., with adhesive, of upper surface 240U of support member 240 to lower surface 102L of substrate 102 after fabrication of traces 114.

Figure 15:
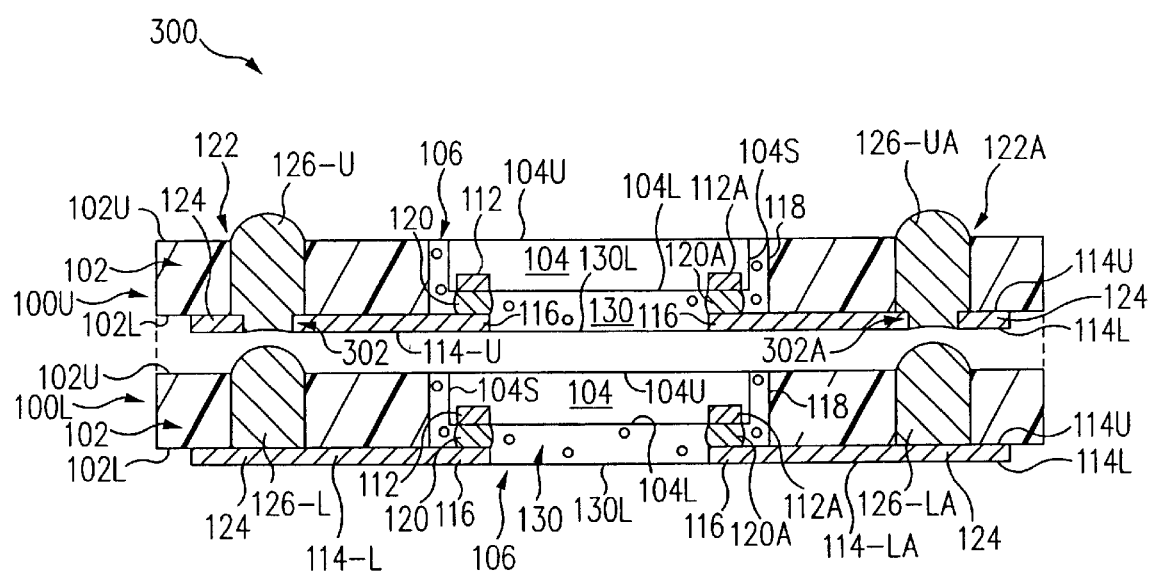
FIG. 15 is a cross-sectional view of the stacked BGA package of FIG. 3 during fabrication in accordance with one embodiment of the present invention.

FIG. 15 is a cross-sectional view of stacked BGA package 300 of FIG. 3 during fabrication in accordance with one embodiment of the present invention. Referring now to FIG. 15, lower BGA package 100L is fabricated as described above with regards to package 100 and FIGS. 614. Upper BGA package 100U is fabricated as described above with regards to package 100 and FIGS. 6–14 except that pinholes 302 are formed in upper traces 114-U.

Illustratively, referring to FIG. 9, by selectively patterning lower mask 904 to further expose pinhole regions 924 of sheet 802 corresponding to pinholes 302 and removing pinhole regions 924 with etchant 910, pinholes 302 are formed. Alternatively, referring to FIG. 11, pinholes 302 are formed by drilling or punching through second ends 124 of traces 114.

Referring again to FIG. 15, upper BGA package 100U is aligned with lower BGA. package 100L. More particularly, upper interconnection balls 126-U and pinholes 302 are aligned with corresponding lower interconnection balls 126-L.

To illustrate, upper interconnection ball 126-UA and pinhole 302A are aligned with lower interconnection ball 126-LA. The other upper interconnection balls 126-U and pinholes 302 are aligned with the other corresponding lower interconnection balls 126-L in a similar manner and so are not discussed further to avoid detracting from the principals of the invention.

Upper BGA package 100U is moved into abutting contact with lower BGA package 100L such that lower interconnection balls 126-L are in abutting contact with corresponding pinholes 302.

BGA packages 100U, 100L are heated to reflow, i.e., melt and resolidify, and fuse together lower interconnection balls 126-L and upper interconnection balls 126-U to form interconnection rods 304. To illustrate, referring now to FIG. 3, lower interconnection ball 126-LA is reflowed and fused together with upper interconnection ball 126-UA to form interconnection rod 304A and stacked BGA package 300. Stacked BGA package 300A of FIG. 4 and package 500 of FIG. 5 are formed in a manner similar to that described above with regards to stacked BGA package 300.

Although fabrication of stacked BGA package 300 on an individual basis is described above, in light of this disclosure, those of skill in the art will recognize that a plurality of stacked BGA packages 300 can also be manufactured in an array and simultaneously in a similar manner.

This application is related to Glenn et al., co-filed and commonly assigned U.S. patent application Ser. No. 09/916, 843, entitled "PRE-DRILLED BALL GRID ARRAY PACKAGE FABRICATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A package comprising:
a substrate comprising a central aperture;
electrically conductive traces coupled to a first surface of said substrate;
an electronic component flip chip mounted to first ends of said traces by electrically conductive bumps, said traces supporting said electronic component in said central aperture; and
electrically conductive interconnection balls formed on second ends of said traces, said interconnection balls extending from said second ends of said traces, through said substrate, and protruding above a second surface of said substrate.

2. The package of claim 1 wherein said substrate comprises interconnection ball apertures covered at said first surface of said substrate by said second ends of said traces.

3. The package of claim 2 wherein said interconnection ball apertures and said second ends of said traces define pockets.

4. The package of claim 3 wherein said interconnection balls are formed in said pockets.

5. The package of claim 1 wherein said electronic component comprises bond pads on a first surface of said electronic component, said bond pads being electrically and physically connected to said traces by said bumps.

6. The package of claim 5 further comprising an encapsulant contacting said first surface of said electronic component.

7. The package of claim 6 wherein said electronic component further comprises:
   a second surface; and
   a side extending between said first surface of said electronic component and said second surface of said electronic component, wherein said encapsulant further contacts said side of said electronic component.

8. The package of claim 7 wherein said encapsulant further contacts a periphery of said second surface of said electronic component directly adjacent said side.

9. The package of claim 7 wherein said encapsulant further contacts and encloses said second surface of said electronic component.

10. The package of claim 1 wherein said central aperture is filled with an encapsulant.

11. The package of claim 10 wherein said electronic component is sealed within said encapsulant.

12. The package of claim 10 wherein said bumps are sealed within said encapsulant.

13. The package of claim 1 further comprising a support member coupled to said first surface of said substrate.

14. The package of claim 13 wherein said support member seals said central aperture to form a pocket.

15. The package of claim 14 further comprising an encapsulant filling said pocket.

16. A stacked package comprising:
   a first substrate comprising a first central aperture;
   electrically conductive first traces coupled to a first surface of said first substrate, said first traces comprising pinholes;
   a first electronic component flip chip mounted to first ends of said first traces by electrically conductive first bumps, said first traces supporting said first electronic component in said first central aperture;
   a second substrate comprising a second central aperture;
   electrically conductive second traces coupled to a first surface of said second substrate;
   a second electronic component flip chip mounted to first ends of said second traces by electrically conductive second bumps, said second traces supporting said second electronic component in said second central aperture; and
   interconnection rods extending from said second traces, through said second substrate, through said pinholes, through said first substrate, and to a height above a second surface of said first substrate.

17. The stacked package of claim 16 wherein said interconnection rods comprise necks extending through said pinholes.

18. The stacked package of claim 17 wherein said interconnection rods further comprise upper body portions and lower body portions, said necks being thinner than said upper body portions and said lower body portions.

19. The stacked package of claim 18 wherein said lower body portions extend between said second traces and to said necks.

20. The stacked package of claim 19 wherein said upper body portions extend from said necks through said first substrate.

21. The stacked package of claim 16 wherein said interconnection rods are locked to said first traces.

22. The stacked package of claim 16 further comprising a support member coupled to said first surface of said second substrate.

23. The stacked package of claim 16 wherein said second electronic component is an image sensor comprising an active area on a first surface of said image sensor.

24. The stacked package of claim 23 further comprising a window coupled to said first surface of said image sensor and protecting said active area.

25. A stacked package comprising:
   a first substrate comprising a first central aperture;
   an electrically conductive first trace coupled to a first surface of said first substrate, said first trace comprising a pinhole;
   a first electronic component supported in said first central aperture by said first trace;
   a second substrate comprising a second central aperture;
   an electrically conductive second trace coupled to a first surface of said second substrate;
   a second electronic component supported in said second central aperture by said second trace; and
   an interconnection rod extending from said second trace, through said second substrate, through said pinhole, through said first substrate, and to a height above a second surface of said first substrate.

26. The stacked package of claim 25 wherein said interconnection rod comprises a neck extending through said pinhole.

27. The stacked package of claim 26 wherein said interconnection rod further comprises an upper body portion and a lower body portion, said neck being thinner than said upper body portion and said lower body portion.

28. The stacked package of claim 27 wherein said lower body portion extends between said second trace and said first trace.

29. The stacked package of claim 28 wherein said upper body portion extends from said first trace through said first substrate.

30. The stacked package of claim 25 wherein said interconnection rod is locked to said first trace.

31. The stacked package of claim 25 further comprising a support member coupled to said first surface of said second substrate.

32. The stacked package of claim 25 wherein said second electronic component is an image sensor comprising an active area on a first surface of said image sensor.

33. The stacked package of claim 32 further comprising a window coupled to said first surface of said image sensor and protecting said active area.

34. A stacked package comprising:
   a means for supporting a first electronic component in a first central aperture of a first substrate;
   a means for supporting a second electronic component in a second central aperture of a second substrate; and
   a means for supporting said first substrate above said second substrate, said means for supporting forming electrical interconnections with said means for supporting a first electronic component and said means for supporting a second electronic component.

* * * * *